(12) United States Patent
Chang et al.

(10) Patent No.: US 12,387,804 B2
(45) Date of Patent: Aug. 12, 2025

(54) ANTI-FUSE MEMORY DEVICE

(71) Applicant: eMemory Technology Inc., Hsin-Chu (TW)

(72) Inventors: Chia-Fu Chang, Hsinchu County (TW); Chun-Hung Lin, Hsinchu County (TW); Jen-Yu Peng, Hsinchu County (TW); You-Ruei Chuang, Hsinchu County (TW)

(73) Assignee: eMemory Technology Inc., Hsin-Chu (TW)

( * ) Notice: Subject to any disclaimer, the term of this patent is extended or adjusted under 35 U.S.C. 154(b) by 169 days.

(21) Appl. No.: 18/370,404

(22) Filed: Sep. 20, 2023

(65) Prior Publication Data

US 2024/0161843 A1 May 16, 2024

Related U.S. Application Data

(60) Provisional application No. 63/424,966, filed on Nov. 14, 2022.

(51) Int. Cl.
  *G11C 17/18* (2006.01)
  *G11C 7/08* (2006.01)
  *G11C 17/16* (2006.01)

(52) U.S. Cl.
  CPC .............. *G11C 17/18* (2013.01); *G11C 7/08* (2013.01); *G11C 17/16* (2013.01)

(58) Field of Classification Search
  CPC ............ G11C 17/18; G11C 7/08; G11C 17/16
  USPC ........................................ 365/225.7
  See application file for complete search history.

(56) References Cited

U.S. PATENT DOCUMENTS 10,459,693 B2 * 10/2019 Lin ..................... G11C 5/14
2019/0043597 A1    2/2019 Miyatake

OTHER PUBLICATIONS

Chou et al., An N40 256Kx44 Embedded RRAM Macro with SL-Precharge SA and Low-Voltage Current Limiter to Improve Read and Write Performance, 2018 IEEE International Solid-State Circuits Conference (ISSCC), Feb. 14, 2018, p. 478 to 479, IEEE, San Francisco, USA.

* cited by examiner

*Primary Examiner* — Huan Hoang
(74) *Attorney, Agent, or Firm* — Winston Hsu

(57) ABSTRACT

An anti-fuse memory device includes an anti-fuse module, a reference current circuit and a controller. A write enable signal enables a write controller and a write buffer of the anti-fuse module to program a selected anti-fuse memory cell in an anti-fuse array of the anti-fuse module, and a timing controller of the anti-fuse module stops a program operation of the anti-fuse array after a sense amplifier of the anti-fuse module changes a state of a readout data signal for a predetermined time duration.

18 Claims, 4 Drawing Sheets

ANTI-FUSE MEMORY DEVICE

CROSS REFERENCE TO RELATED APPLICATIONS

This application claims the benefit of U.S. Provisional Application No. 63/424,966, filed on Nov. 14, 2022. The content of the application is incorporated herein by reference.

BACKGROUND OF THE INVENTION

1. Field of the Invention

The invention is related to an anti-fuse memory device, and more particular to a program scheme applied to the anti-fuse memory device to reduce program disturbance.

2. Description of the Prior Art

Non-volatile memory (NVM) devices are capable of saving stored data after the power is turned off and thus have become a type of memory device widely adopted in personal computers and electronic apparatuses.

An anti-fuse memory device is a one-time programming (OTP) NVM widely applied in electronic apparatuses. By applying a voltage for the current to flow through the junction of the oxide layer, the dopant is shifted so that an oxide layer of the anti-fuse transistor is broken down (also called "ruptured") to form a conductive path. However, anti-fuse memory cells in the memory array may be over-programmed due to an inappropriate program scheme.

SUMMARY OF THE INVENTION

An embodiment of the present invention discloses anti-fuse memory device. The anti-fuse memory device comprises a first anti-fuse module and a reference current circuit. The first anti-fuse module comprises a first anti-fuse array, a first decoder, a first write buffer, a first write controller, a first timing controller, and a first sense amplifier. The first anti-fuse array comprises a plurality of first anti-fuse control lines, a plurality of first word lines, a plurality of first bit lines and a plurality of first anti-fuse memory cells. Each of the first anti-fuse memory cells is coupled to a corresponding first anti-fuse control line, a corresponding first word line and a corresponding first bit line. The first decoder is configured to couple a selected first bit line of the first bit lines to a signal end of the first decoder according to a first address signal. The first write buffer is coupled to the signal end of the first decoder and configured to receive a first program current from the selected first bit line through the first decoder to generate a first sensing voltage according to a first write control signal. The first write controller is configured to generate the first write control signal according to a first write enable signal in a first program operation of the first anti-fuse array. The first timing controller is configured to generate the first write enable signal according to a first readout data signal. The first sense amplifier comprises a first input end configured to couple to the first write buffer to receive the first sensing voltage, a second input end configured to receive a reference voltage, and an output end coupled to the first timing controller and configured to output the first readout data signal to the first timing controller. The reference current circuit is configured to generate a reference current, and coupled to the first anti-fuse module. The first timing controller stops the first program operation after the first sense amplifier changes a state of the first readout data signal for a predetermined time duration.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
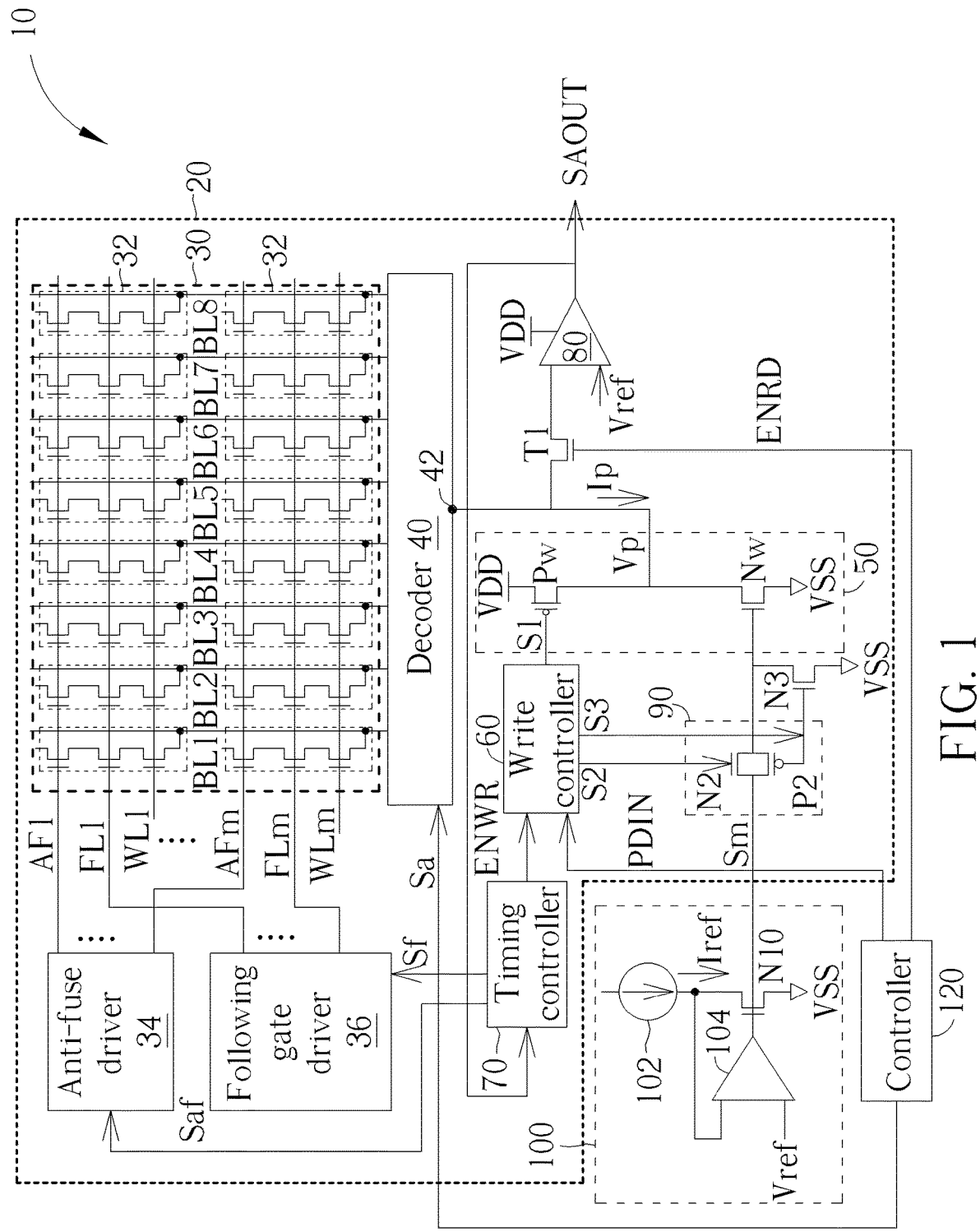
FIG. 1 shows an anti-fuse memory device according to an embodiment of the present invention.
Figure 2:
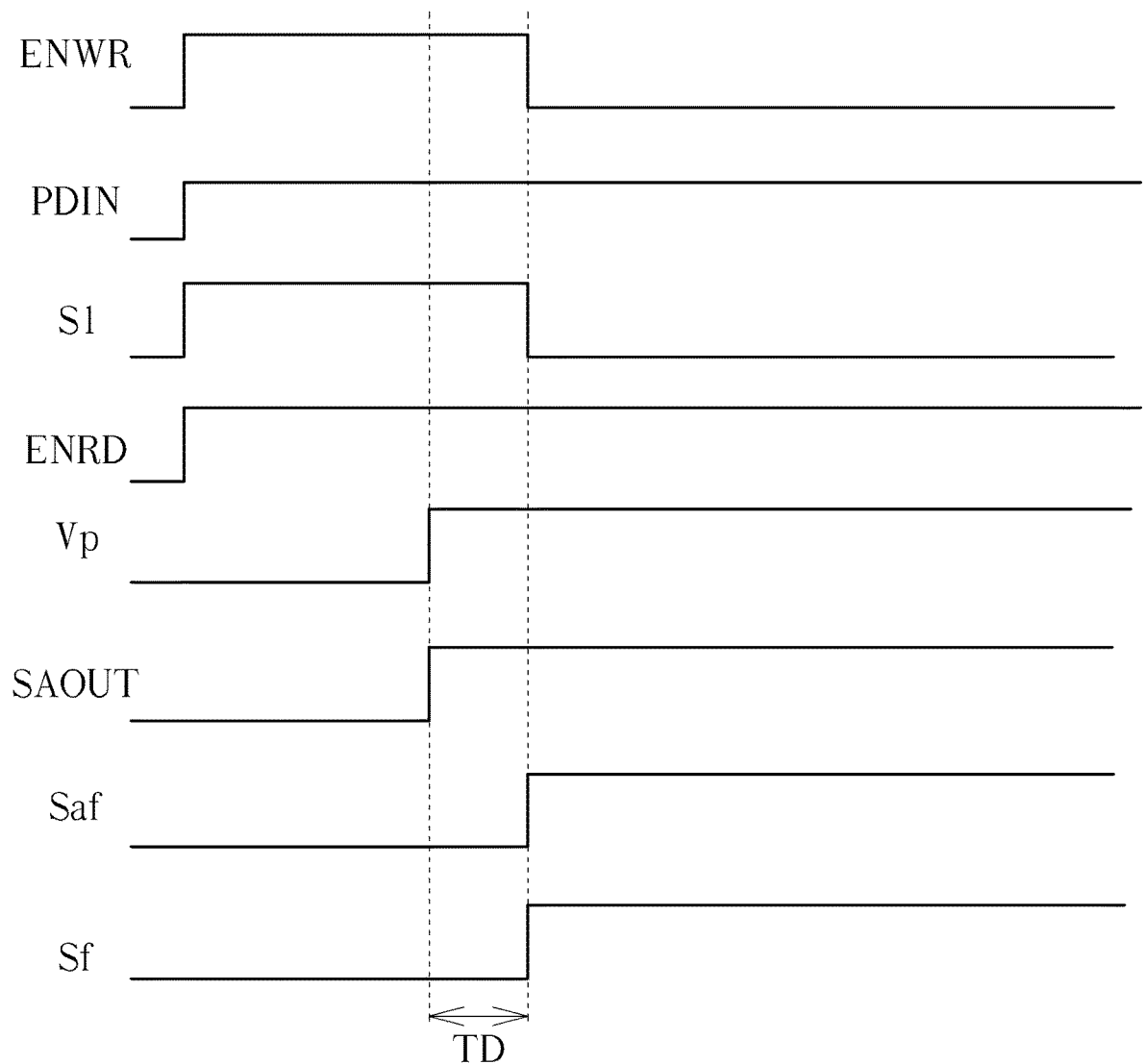
FIG. 2 is a timing diagram of the anti-fuse memory device in FIG. 1.

FIG. 1 shows an anti-fuse memory device 10 according to an embodiment of the present invention, and FIG. 2 is a timing diagram of the anti-fuse memory device in FIG. 1. The anti-fuse memory device 10 comprises an anti-fuse module 20, and a reference current circuit 100. The anti-fuse module 20 comprises an anti-fuse array 30, a decoder 40, a write buffer 50, a write controller 60, a timing controller 70, and a sense amplifier 80. The anti-fuse array 30 comprises a plurality of anti-fuse memory cells 32, a plurality of anti-fuse control lines AF1 to AFm, a plurality of word lines WL1 to WLm, and a plurality of bit lines BL1 to BL8, where m is an integer greater than 1. Each of the anti-fuse memory cells 32 is coupled to a corresponding anti-fuse control line, a corresponding word line and a corresponding bit line. The decoder 40 is configured to couple a selected bit line of the bit lines BL1 to BL8 to a signal end 42 of the decoder 40 according to an address signal Sa. The write buffer 50 is coupled to the signal end 42 of the decoder 40 and configured to receive a program current Ip from the selected bit line through the decoder 40 to generate a sensing voltage Vp according to a write control signal S1. The write controller 60 is configured to generate the write control signal S1 according to a write enable signal ENWR in a program operation of the anti-fuse array 30. In the program operation of the anti-fuse array 30, the anti-fuse memory device 10 programs one or more anti-fuse memory cells 32 of the anti-fuse array 30. The timing controller 70 is configured to generate the write enable signal ENWR according to a readout data signal SAOUT. The sense amplifier 80 comprises a first input end configured to receive the sensing voltage Vp from the write buffer 50, a second input end configured to receive a reference voltage Vref, and an output end coupled to the timing controller 70 and configured to output the readout data signal SAOUT to the timing controller 70. The reference current circuit 100 is configured to generate a reference current Iref and coupled to the anti-fuse module 20.

As shown in FIG. 2, the timing controller 70 changes a state (i.e., low or high) of the write enable signal ENWR after the sense amplifier 80 changes a state (i.e., 0 or 1) of the readout data signal SAOUT for a predetermined time duration TD. In detail, after the readout data signal SAOUT is pulled up from low (i.e., state "0") to high (i.e., state "1") by the sense amplifier 80 for the predetermined time duration TD, the write enable signal ENWR is pulled down from high (i.e., state "1") to low (i.e., state "0") by the timing controller 70. The write enable signal ENWR is used to indicate whether the program operation of the anti-fuse array 30 has been finished. In the embodiment, when the write enable signal ENWR is low, it indicates that the program operation has been finished. When the write enable signal ENWR is high, it indicates that the program operation has not been finished. In addition, the write enable signal ENWR is also used to enable or disable the program operation of the anti-fuse array 30. When the write enable signal ENWR is high, the program operation of the anti-fuse array 30 is allowed to be performed. When the write enable signal ENWR is low, the program operation of the anti-fuse array 30 is not allowed to be performed. Therefore, the program operation of the anti-fuse array 30 will be stopped after the sense amplifier 80 changes the state of the readout data signal SAOUT for the predetermined time duration TD. In other words, the anti-fuse memory device 10 stops programming the anti-fuse memory cells 32 of the anti-fuse array 30 after the sense amplifier 80 changes the state of the readout data signal SAOUT for the predetermined time duration TD.

The anti-fuse memory device 10 may further comprise a controller 120 configured to generate the address signal Sa and a data enable signal PDIN. The decoder 40 couples the signal end 42 to the selected first bit line according to the address signal Sa, and the anti-fuse array 30 starts the program operation according to the data enable signal PDIN. In detail, the address signal Sa is used to indicate which anti-fuse memory cell 32 should be programmed, and the data enable signal PDIN is used to indicate whether the program operation of the anti-fuse array 30 should be performed. In the embodiment, if the program operation of the anti-fuse array 30 should be performed, the data enable signal PDIN is set to high (i.e., "1"); otherwise, the data enable signal PDIN is set to low (i.e., "0"). Accordingly, when the program operation of the anti-fuse array 30 is performed, the write enable signal ENWR and the data enable signal PDIN are set to high (i.e., "1").

The reference current circuit 100 comprises a reference current source 102, a transistor N10 and an operational amplifier 104. The reference current source 102 is configured to provide the reference current Iref. The transistor N10 having a first end coupled to an output end of the reference current source 102, a second end coupled to a first power supply voltage terminal VSS, and a control end coupled to an output end of the operational amplifier 104. The operational amplifier 104 comprises a first input end coupled to the output end of the reference current source 102, a second input end configured to receive the reference voltage Vref, and an output end coupled to the control end of the transistor N10 and the anti-fuse module 20 for outputting a current mirror signal Sm.

The anti-fuse module 20 may further comprise a pass gate 90 and a transistor N3. The pass gate 90 has a first end coupled to the output end of the operational amplifier 104, a second end coupled to the write buffer 50, a first control end for receiving a first pass gate control signal S2, and a second control end for receiving a second pass gate control signal S3. The transistor N3 has a first end coupled to the second end of the pass gate 90, a second end coupled to the first power supply voltage terminal VSS, and a control end coupled to the second control end of the pass gate 90. The write controller 60 generates the first pass gate control signal S2 and the second pass gate control signal S3 according to the write enable signal ENWR and the data enable signal PDIN, transmits the first pass gate control signal S1 to the first control end of the pass gate 90, and transmits the second pass gate control signal S3 to the second control end of the pass gate 90 and the control end of the transistor N3. The pass gate 90 may comprise an n-type transistor N2 and a p-type transistor P2. When the first pass gate control signal S2 is high and the second pass gate control signal S3 is low, the n-type transistor N2 and the p-type transistor P2 are turned on, and the transistor N3 is turned off. Therefore, the current mirror signal Sm is transmitted from the operational amplifier 104 to the write buffer 50. When the first pass gate control signal S2 is low and the second pass gate control signal S3 is high, the n-type transistor N2 and the p-type transistor P2 are turned off, and the transistor N3 is turned on. Therefore, the write buffer 50 would not receive the current mirror signal Sm from the operational amplifier 104, and the write buffer 50 is biased by the first power supply voltage terminal VSS.

The write buffer 50 may comprise a p-type transistor Pw and an n-type transistor Nw. The p-type transistor Pw has a first end coupled to a second power supply voltage terminal VDD, a second end coupled to the signal end 42 of the decoder 40, and a control end for receiving the write control signal S1 from the write controller 60. The n-type transistor Nw has a first end coupled to the second end of the p-type transistor Pw, a second end coupled to the first power supply voltage terminal VSS, and a control end coupled to the second end of the pass gate 90 and the first end of the transistor N3.

When any of the anti-fuse memory cells 32 needs to be programmed, the anti-fuse memory device 10 sets the write enable signal ENWR and the data enable signal PDIN to be high (i.e., "1") so as to perform the program operation of the anti-fuse array 30. During the program operation of the anti-fuse array 30, the write control signal S1 output from the write controller 60 is high (the write controller 60 generates the write control signal S1 according to the write enable signal ENWR and the data enable signal PDIN) and the current mirror signal Sm is high. Therefore, the p-type transistor Pw is turned off, and the n-type transistor Nw is turned on. Accordingly, the selected bit line coupled to an anti-fuse memory cell 32 to be programmed would be pulled down to the voltage level of the first power supply voltage terminal VSS. Consequently, a program current Ip flows from the selected bit line through the decoder 40 and the n-type transistor Nw to the first power supply voltage terminal VSS. Due to the increase of the program current Ip, the sensing voltage Vp increases accordingly. Since the transistor N10 of the reference current circuit 100 and the n-type transistor Nw of the write buffer 50 form a current mirror circuit, the program current Ip can be controlled to be N times the reference current Iref, wherein N is greater than zero could be determined by a channel width-to-length (W/L) ratio of the n-type transistor Nw. Once the program current Ip exceeds N times the reference current Iref, the sense amplifier 80 changes the state of the readout data signal SAOUT from low to high so as to indicate the program operation of the anti-fuse array 30 has been finished. Accordingly, the write enable signal ENWR would be pulled down from high to low after the sense amplifier 80 changes the state of the readout data signal SAOUT for the predetermined time duration TD to stop the program operation of the anti-fuse array 30.

When the program operation is finished or the anti-fuse memory cell 32 is not need to be programmed, the write control signal S1 output from the write controller 60 is low to turn on the p-type transistor Pw, and the first pass gate control signal S2 is low and the second pass gate control signal S3 is high to turn on the transistor N3 and turn off the pass gate 90 and the n-type transistor Nw.

In an embodiment of the present invention, the controller 120 may be further configured to generate a read enable signal ENRD, and the anti-fuse module 20 may further comprise a read switch Ti configured to couple the first input end of the sense amplifier 80 to the output of the write buffer 50 and the signal end 42 according to the read enable signal ENRD. During the above program operation of the anti-fuse array 30, the read switch Ti is turned on. Therefore, a voltage level of the first input end of the sense amplifier 80 is equal to the sensing voltage Vp. As the program current Ip increases, the sensing voltage Vp would increase. When the sensing voltage Vp increase to be equal to the reference voltage Vref, the sense amplifier 80 would output the readout data signal SAOUT. Moreover, since the second input end of the sense amplifier 80 and the second input end of the operational amplifier 104 are biased by the same reference voltage Vref, the program current Ip could be controlled to be N times the reference current Iref.

As described above, the timing controller 70 stops the program operation of the anti-fuse array 30 after the sense amplifier 80 changes the state of the readout data signal SAOUT for the predetermined time duration TD. Therefore, the program current Ip would flows through the anti-fuse memory cell 32 to be programmed until the sense amplifier 80 changes the state of the readout data signal SAOUT from low to high (i.e., from "0" to "1") for the predetermined time duration TD. The predetermined time duration TD could be 1 microsecond to 2 microseconds, but the present invention is not limited thereto.

The anti-fuse module 20 may further comprise an anti-fuse driver 34 for providing anti-fuse voltages to the anti-fuse control lines AF1 to AFm. The timing controller 70 may generate an anti-fuse control signal Saf according to the readout data signal SAOUT and transmit the anti-fuse control signal Saf to the anti-fuse driver 34 to control the anti-fuse driver 34 stop providing the anti-fuse voltages to the anti-fuse control lines AF1 to AFm. Therefore, once the program operation of the anti-fuse memory cell 32 to be programmed is finished, the anti-fuse driver 34 could be turned off immediately.

The anti-fuse array 30 may further comprise a plurality of following gate lines FL1 to FLm, and the anti-fuse module 20 may further comprise a following gate driver 36 for providing following gate voltages to the following gate lines FL1 to FLm. The timing controller 70 may generate a following gate control signal Sf according to the readout data signal SAOUT and transmit the following gate control signal Sf to the following gate driver 36 to control the following gate driver 36 stop providing the following gate voltages to the following gate lines FL1 to FLm. Therefore, once the program operation of the anti-fuse memory cell 32 to be programmed is finished, the following gate driver 36 could be turned off immediately.

Figure 3:
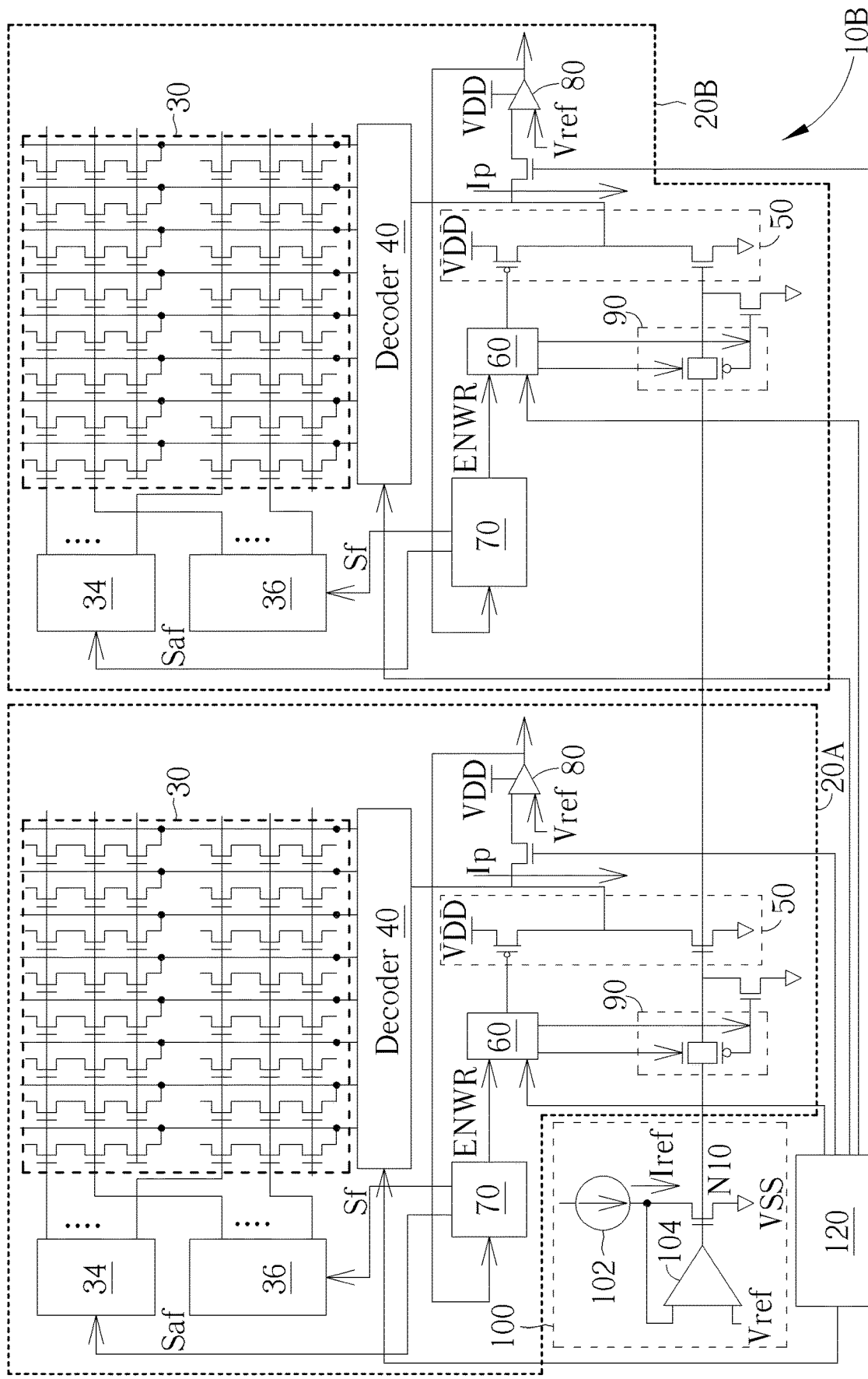
FIG. 3 shows an anti-fuse memory device according to another embodiment of the present invention.

FIG. 3 shows an anti-fuse memory device 10B according to another embodiment of the present invention. The anti-fuse memory device 10B comprises a first anti-fuse module 20A, a second anti-fuse module 20B, the reference current circuit 100 and the controller 120. The controller 120 controls the first anti-fuse module 20A and the second anti-fuse module 20B, and the first anti-fuse module 20A and the second anti-fuse module 20B share the same reference current circuit 100. The structures of the first anti-fuse module 20A and the second anti-fuse module 20B are the same as the structure of the anti-fuse module 20, and the operations of the first anti-fuse module 20A and the second anti-fuse module 20B are the same as the operations of the anti-fuse module 20. Therefore, the structures and the operations of the first anti-fuse module 20A and the second anti-fuse module 20B would not be repeated.

Figure 4:
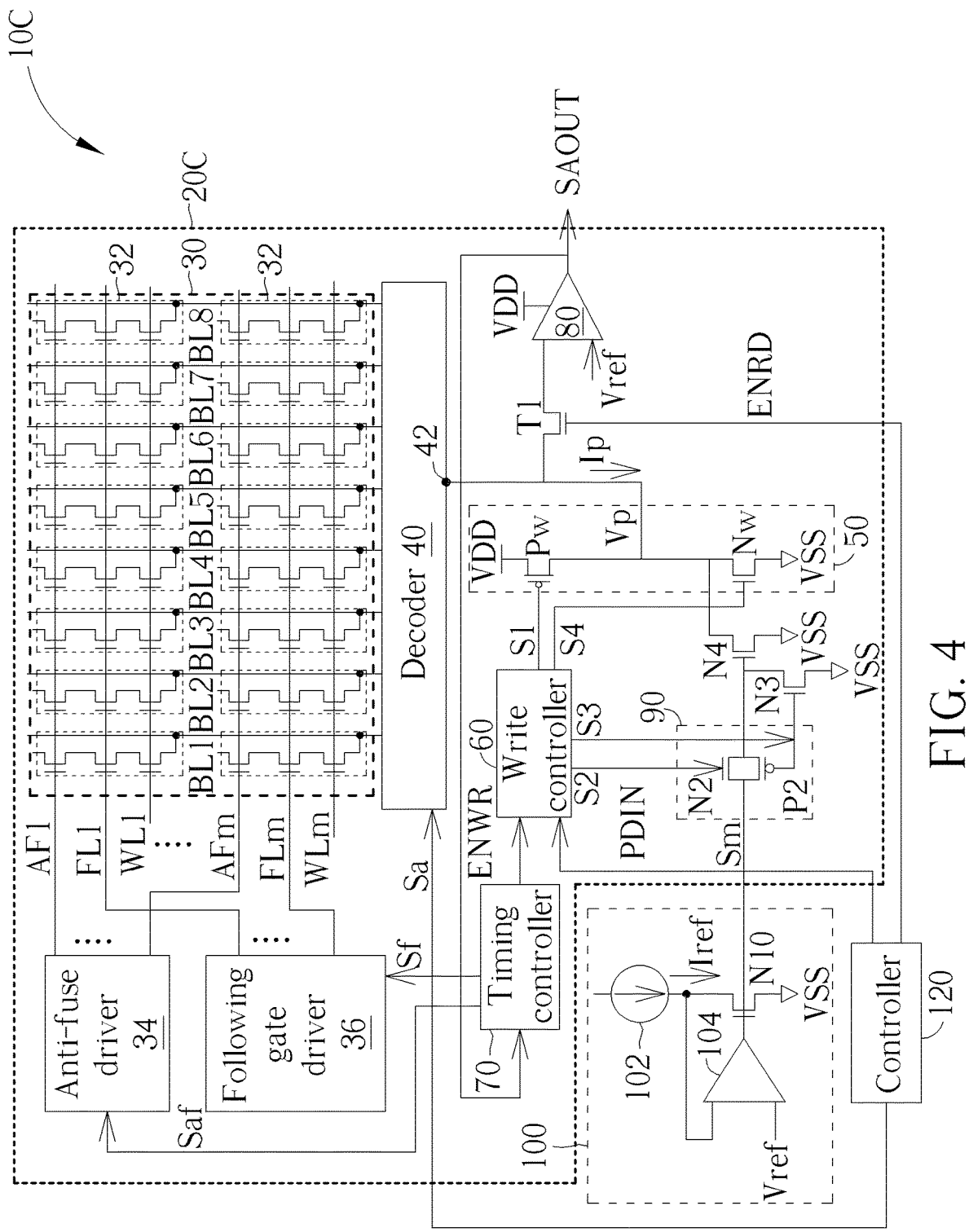
FIG. 4 shows an anti-fuse memory device according to another embodiment of the present invention.

In the embodiment of FIG. 1, the transistor N10 of the reference current circuit 100 and the n-type transistor Nw of the write buffer 50 form a current mirror circuit. In another embodiment, the current mirror circuit of the anti-fuse memory device may be formed in a different way to increase design flexibility of the anti-fuse memory device. FIG. 4 shows an anti-fuse memory device 10C according to another embodiment of the present invention. The anti-fuse memory device 10C is similar to the anti-fuse memory device 10, and main difference between the anti-fuse memory device 10C and the anti-fuse memory device 10 is that an anti-fuse module 20C of the anti-fuse memory device 10C further comprises a transistor N4. The transistor N4 has a first end coupled to the write buffer 60, a second end coupled to the first power supply voltage terminal VSS, and a control end coupled to the second end of the pass gate 90 and the first end of the transistor N3. The control end of the p-type transistor Pw is coupled to the write controller 60 and receives the write control signal S1 from the write controller 60. The control end of the n-type transistor Nw is coupled to the write controller 60 and receives another write control signal S4 from the write controller 60. The write controller 60 generates the first pass gate control signal S2 and the second pass gate control signal S3 according to the write enable signal ENWR and the data enable signal PDIN, transmits the first pass gate control signal S2 to the first control end of the pass gate 90, and transmits the second pass gate control signal S3 to the second control end of the pass gate 90 and the control end of the transistor N3. During the program operation of the anti-fuse array 30, the write control signal S1 is high, the write control signal S4 is low, and the current mirror signal Sm is high. Therefore, the p-type transistor Pw is turned off, the n-type transistor Nw is turned off, and the transistor N4 receives the current mirror signal Sm, so that the transistor N4 is turned on. Accordingly, the program current Ip would flow through the transistor N4. Since the transistor N10 of the reference current circuit 100 and the transistor N4 form a current mirror circuit, the program current Ip could be controlled to be N times the reference current Iref, wherein N could be determined by a channel width-to-length (W/L) ratio of the transistor N4.

Since the timing controller 70 would stop the program operation of the anti-fuse array 30 after the sense amplifier 80 changes the state of the readout data signal SAOUT for the predetermined time duration TD, the selected anti-fuse memory cell 32 to be programmed would not over-programmed. Therefore, the selected anti-fuse memory cell 32 to be programmed could be programmed precisely. In addition, since the second input end of the sense amplifier 80 and the second input end of the operational amplifier 104 are biased by the same reference voltage Vref, the program current Ip could be controlled to be N times the reference current Iref. Moreover, since different anti-fuse modules are respectively controlled by the controller 120, program disturbance between the anti-fuse modules could be reduced. Furthermore, since the first anti-fuse module 20A and the second anti-fuse module 20B share the same reference current circuit 100, a layout area for another reference current circuit 100 is not necessary.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:
1. An anti-fuse memory device, comprising:
a first anti-fuse module, comprising:
a first anti-fuse array, comprising:
a plurality of first anti-fuse control lines;
a plurality of first word lines;
a plurality of first bit lines; and
a plurality of first anti-fuse memory cells each coupled to a corresponding first anti-fuse control line, a corresponding first word line and a corresponding first bit line;
a first decoder, configured to couple a selected first bit line of the first bit lines to a signal end of the first decoder;
a first write buffer, coupled to the signal end of the first decoder and configured to receive a first program current from the selected first bit line through the first decoder to generate a first sensing voltage according to a first write control signal;
a first write controller, configured to generate the first write control signal according to a first write enable signal in a first program operation of the first anti-fuse array;
a first timing controller, configured to generate the first write enable signal according to a first readout data signal; and
a first sense amplifier, comprising:
a first input end, configured to receive the first sensing voltage from the first write buffer;
a second input end, configured to receive a reference voltage; and
an output end, coupled to the first timing controller and configured to output the first readout data signal to the first timing controller, and a state of the first readout data signal changed when the first sensing voltage is either greater than or equal to the reference voltage; and
a reference current circuit, configured to generate a reference current, and coupled to the first write buffer;
wherein the first timing controller stops the first program operation after the first sense amplifier changes the state of the first readout data signal for a predetermined time duration.
2. The anti-fuse memory device of claim 1 further comprising a second anti-fuse module coupled to the reference current circuit, and the second anti-fuse module comprising:
a second anti-fuse array, comprising:
a plurality of second anti-fuse control lines;
a plurality of second word lines;
a plurality of second bit lines; and
a plurality of second anti-fuse memory cells each coupled to a corresponding second anti-fuse control line, a corresponding second word line and a corresponding second bit line;
a second decoder, configured to couple a selected second bit line of the second bit lines to a signal end of the second decoder;
a second write buffer, coupled to the reference current circuit and the signal end of the second decoder and configured receive a second program current from the selected second bit line through the second decoder to generate a second sensing voltage according to a second write control signal;
a second write controller, configured to generate the second write control signal according to a second write enable signal in a second program operation of the second anti-fuse array;
a second timing controller, configured to generate the second write enable signal according to a second readout data signal; and
a second sense amplifier, comprising:
a first input end;
a second input end, configured to receive the reference voltage; and
an output end, coupled to the second timing controller and configured to output the second readout data signal to the second timing controller, and a state of the second readout data signal changed when the second sensing voltage is either greater than or equal to the reference voltage;
wherein the second timing controller stops the second program operation after the second sense amplifier changes the state of the second readout data signal for the predetermined time duration.
3. The anti-fuse memory device of claim 2, wherein the first anti-fuse module further comprises a first anti-fuse driver for providing first anti-fuse voltages to the first anti-fuse control lines, and the second anti-fuse module further comprises a second anti-fuse driver for providing second anti-fuse voltages to the second anti-fuse control lines;
wherein the first timing controller is further configured to generate a first anti-fuse control signal according to the first readout data signal and transmit the first anti-fuse control signal to the first anti-fuse driver to control the first anti-fuse driver to stop providing the first anti-fuse voltages to the first anti-fuse control lines; and
wherein the second timing controller is further configured to generate a second anti-fuse control signal according to the second readout data signal and transmit the second anti-fuse control signal to the second anti-fuse driver to control the second anti-fuse driver to stop providing the second anti-fuse voltages to the second anti-fuse control lines.
4. The anti-fuse memory device of claim 1 further comprising a controller configured to generate a first address signal and a first data enable signal;
wherein the first decoder couples the signal end of the first decoder to the selected first bit line according to the first address signal; and
wherein the first anti-fuse array starts the first program operation according to the first write enable signal and the first data enable signal.
5. The anti-fuse memory device of claim 4, wherein the first anti-fuse module further comprises a first read switch configured to couple the first input end of the first sense amplifier to the signal end of the first decoder according to a first read enable signal;
wherein the first read switch is turned on during the first program operation of the first anti-fuse array; and
wherein the controller is further configured to generate the first read enable signal.
6. The anti-fuse memory device of claim 1, wherein the reference current circuit comprises:
a reference current source, configured to provide the reference current;
a transistor, having a first end coupled to an output end of the reference current source, a second end coupled to a first power supply voltage terminal, and a control end; and an operational amplifier, comprising:
- a first input end, coupled to the output end of the reference current source;
- a second input end, configured to receive the reference voltage; and
- an output end, coupled to the control end of the transistor and the anti-fuse module, and configured to output a current mirror signal.

7. The anti-fuse memory device of claim 6, wherein the first anti-fuse module further comprises:
- a pass gate, having a first end coupled to the output end of the operational amplifier, a second end coupled to the first write buffer, a first control end and a second control end; and
- a transistor, having a first end coupled to the second end of the pass gate, a second end coupled to the first power supply voltage terminal, and a control end coupled to the second control end of the pass gate;
- wherein the first write controller is further configured to generate a first pass gate control signal and a second pass gate control signal according to the first write enable signal and the first data enable signal, transmit the first pass gate control signal to the first control end of the pass gate, and transmit the second pass gate control signal to the second control end of the pass gate and the control end of the transistor of the first anti-fuse module.

8. The anti-fuse memory device of claim 7, wherein the pass gate is turned on and the transistor of the first anti-fuse module is turned off during the first program operation of the first anti-fuse array.

9. The anti-fuse memory device of claim 7, wherein the first write buffer comprising:
- a p-type transistor, having a first end coupled to a second power supply voltage terminal, a second end coupled to the signal end of the decoder, and a control end for receiving the first write control signal; and
- an n-type transistor, having a first end coupled to the second end of the p-type transistor, a second end coupled to the first power supply voltage terminal, and a control end coupled to the second end of the pass gate and the first end of the transistor of the first anti-fuse module.

10. The anti-fuse memory device of claim 9, wherein the p-type transistor is turned off and the n-type transistor is turned on during the first program operation of the first anti-fuse array.

11. The anti-fuse memory device of claim 9, wherein a channel width-to-length (W/L) ratio of the n-type transistor is N times a channel width-to-length of the transistor of the reference current circuit, N is greater than zero; and
- wherein once the first program current from the selected first bit line exceeds N times the reference current, the first sense amplifier changes the state of the first readout data signal.

12. The anti-fuse memory device of claim 9, wherein the transistor of the reference current circuit and the n-type transistor of the first write buffer form a current mirror circuit.

13. The anti-fuse memory device of claim 6, wherein the first anti-fuse module further comprises:
- a pass gate, having a first end coupled to the output end of the operational amplifier, a second end, a first control end and a second control end;
- a first transistor, having a first end coupled to the second end of the pass gate, a second end coupled to the first power supply voltage terminal, and a control end coupled to the second control end of the pass gate; and
- a second transistor, having a first end coupled to the first write buffer, a second end coupled to the first power supply voltage terminal, and a control end coupled to the second end of the pass gate and the first end of the first transistor;
- wherein the first write controller is further configured to generate a first pass gate control signal and a second pass gate control signal according to the first write enable signal and the first data enable signal, transmit the first pass gate control signal to the first control end of the pass gate, and transmit the second pass gate control signal to the second control end of the pass gate and the control end of the first transistor.

14. The anti-fuse memory device of claim 13, wherein the pass gate is turned on, the first write buffer is turned off, the first transistor is turned off, and the second transistor is turned on during the first program operation of the first anti-fuse array.

15. The anti-fuse memory device of claim 13, wherein the first write buffer comprises:
- a p-type transistor, having a first end coupled to a second power supply voltage terminal, a second end coupled to the signal end of the decoder, and a control end for receiving the first write control signal; and
- an n-type transistor, having a first end coupled to the second end of the p-type transistor, a second end coupled to the first power supply voltage terminal, and a control end coupled to the first write controller.

16. The anti-fuse memory device of claim 15, wherein the transistor of the reference current circuit and the second transistor form a current mirror circuit.

17. The anti-fuse memory device of claim 15, wherein the p-type transistor and the n-type transistor are turned off during the first program operation of the first anti-fuse array.

18. The anti-fuse memory device of claim 15, wherein a channel width-to-length (W/L) ratio of the second transistor is N times a channel width-to-length of the transistor of the reference current circuit, N is greater than zero; and
- wherein once the first program current from the selected first bit line exceeds N times the reference current, the first sense amplifier changes the state of the first readout data signal.

* * * * *